(12) United States Patent
Gao et al.

(10) Patent No.: US 11,895,900 B2
(45) Date of Patent: Feb. 6, 2024

(54) METHOD OF ENCAPSULATING DISPLAY SUBSTRATE AND COUNTER SUBSTRATE, ENCAPSULATED DISPLAY PANEL, DISPLAY APPARATUS, AND COUNTER SUBSTRATE

(71) Applicant: BOE Technology Group Co., Ltd., Beijing (CN)

(72) Inventors: Xinwei Gao, Beijing (CN); Qihe Chen, Beijing (CN); Peng Li, Beijing (CN); Dandan Zang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 852 days.

(21) Appl. No.: 16/968,591

(22) PCT Filed: Oct. 16, 2019

(86) PCT No.: PCT/CN2019/111457
§ 371 (c)(1),
(2) Date: Aug. 8, 2020

(87) PCT Pub. No.: WO2021/072675
PCT Pub. Date: Apr. 22, 2021

(65) Prior Publication Data
US 2023/0157134 A1    May 18, 2023

(51) Int. Cl.
*H10K 59/80* (2023.01)
*H10K 71/00* (2023.01)

(52) U.S. Cl.
CPC ..... *H10K 59/8723* (2023.02); *H10K 59/8722* (2023.02); *H10K 71/00* (2023.02)

(58) Field of Classification Search
CPC ........... H10K 59/8723; H10K 59/8722; H10K 71/00; H10K 50/8426; H10K 50/841; H10K 50/84
See application file for complete search history.

(56) References Cited

U.S. PATENT DOCUMENTS

| | | | |
|---|---|---|---|
| 9,570,478 B2* | 2/2017 | Kim | H01L 27/1248 |
| 9,851,606 B2* | 12/2017 | Cha | G02F 1/1339 |

(Continued)

FOREIGN PATENT DOCUMENTS

| | | |
|---|---|---|
| CN | 201285484 Y | 8/2009 |
| CN | 103682149 A | 3/2014 |

(Continued)

OTHER PUBLICATIONS

First Office Action in the Chinese Patent Application No. 201980001991.6, dated Oct. 26, 2021; English translation attached.

(Continued)

*Primary Examiner* — Caleb E Henry
(74) *Attorney, Agent, or Firm* — Intellectual Valley Law, P.C.

(57) ABSTRACT

A method of encapsulating a display substrate and a counter substrate, an encapsulated display panel, a display apparatus, and a counter substrate are provided. The encapsulated display panel includes a display substrate; a counter substrate facing the display substrate; and a sealant filled in a space between the display substrate and a counter substrate. The display substrate in a peripheral area has a plurality of protruding parts and a plurality of recessing parts, resulting in an uneven surface topography. The counter substrate in at least a portion of the peripheral area has a counter surface topography substantially complementary to the surface topography of the display substrate. The counter substrate in the peripheral area has a plurality of counter protruding parts.

9 Claims, 8 Drawing Sheets

(56) References Cited

U.S. PATENT DOCUMENTS

| | | | | |
|---|---|---|---|---|
| 9,971,205 | B2* | 5/2018 | Huang | G02F 1/13394 |
| 10,197,842 | B2* | 2/2019 | Kobayashi | G02F 1/13439 |
| 2011/0090445 | A1* | 4/2011 | Kim | G02F 1/1339 |
| | | | | 349/139 |
| 2014/0061624 | A1 | 3/2014 | Nagata et al. | |
| 2014/0138716 | A1 | 5/2014 | Satou et al. | |
| 2014/0320789 | A1* | 10/2014 | Son | G02F 1/133345 |
| | | | | 156/60 |
| 2018/0356697 | A1* | 12/2018 | Ni | G02F 1/1368 |

FOREIGN PATENT DOCUMENTS

| | | |
|---|---|---|
| CN | 103839969 A | 6/2014 |
| CN | 104122698 A | 10/2014 |
| CN | 107085323 A | 8/2017 |
| CN | 109633989 A | 4/2019 |
| CN | 110187573 A | 8/2019 |

OTHER PUBLICATIONS

International Search Report & Written Opinion dated Jul. 20, 2020, regarding PCT/CN2019/111457.

* cited by examiner

METHOD OF ENCAPSULATING DISPLAY SUBSTRATE AND COUNTER SUBSTRATE, ENCAPSULATED DISPLAY PANEL, DISPLAY APPARATUS, AND COUNTER SUBSTRATE

CROSS-REFERENCE TO RELATED APPLICATION

This application is a national stage application under 35 U.S.C. § 371 of International Application No. PCT/CN2019/111457, filed Oct. 16, 2019, the contents of which are incorporated by reference in the entirety.

TECHNICAL FIELD

The present invention relates to display technology, more particularly, to a method of encapsulating a display substrate and a counter substrate, an encapsulated display panel, a display apparatus, and a counter substrate.

BACKGROUND

Organic light emitting diode (OLED) display apparatuses are self-emissive devices, and do not require backlights. OLED display apparatuses also provide more vivid colors and a larger color gamut as compared to the conventional liquid crystal display (LCD) apparatuses. Further, OLID display apparatuses can be made more flexible, thinner, and lighter than a typical LCD apparatus. An OLED display apparatus typically includes an anode, an organic layer including an organic light emitting layer, and a cathode. OLEDs can be either a bottom-emission type OLED or a top-emission type OLED.

SUMMARY

In one aspect, the present invention provides an encapsulated display panel, comprising a display substrate; a counter substrate facing the display substrate; and a sealant filled in a space between the display substrate and a counter substrate; wherein the display substrate in a peripheral area has a plurality of protruding parts and a plurality of recessing parts, resulting in an uneven surface topography; and the counter substrate in at least a portion of the peripheral area has a counter surface topography substantially complementary to the surface topography of the display substrate, the counter substrate in the peripheral area has a plurality of counter protruding parts.

Optionally, the plurality of counter protruding parts of the counter substrate are disposed at positions corresponding to the plurality of recessing parts of the display substrate, a respective one of the plurality of counter protruding parts spaced apart from a respective one of the plurality of recessing parts by the sealant.

Optionally, the counter substrate in the peripheral area has a plurality of counter recessing parts; and the plurality of protruding parts of the display substrate are disposed at positions corresponding to the plurality of counter recessing parts of the counter substrate, a respective one of the plurality of protruding parts spaced apart from a respective one of the plurality of counter recessing parts by the sealant.

Optionally, the counter substrate in substantially all of the peripheral area has the counter surface topography substantially complementary to the surface topography of the display substrate.

Optionally, the encapsulated display panel further comprises a sealant frame; wherein the sealant frame, the display substrate, and the counter substrate enclose a space into which the sealant is filled.

Optionally, the counter substrate in the peripheral area has a plurality of corner protrusions; and a respective one of the plurality of corner protrusions is in direct contact with the sealant frame, protrudes toward a space between the sealant frame and the display substrate, and is at a corner of the display substrate.

Optionally, a total number of the plurality of corner protrusions is four.

Optionally, the counter substrate comprises a base substrate; and a counter surface layer comprising the plurality of counter protruding parts at least in the peripheral area on the base substrate; wherein the counter surface layer has the counter surface topography substantially complementary to the surface topography of the display substrate.

Optionally, the counter surface layer further comprises a plurality of corner protrusions; wherein a respective one of the plurality of corner protrusions is in direct contact with a sealant frame, protrudes toward a space between the sealant frame and the display substrate and, is at a corner of the display substrate.

In another aspect, the present invention provides a display apparatus, comprising the encapsulated display panel described herein or fabricated by a method described herein, and one or more integrated circuits connected to the display substrate.

In another aspect, the present invention provides a method of encapsulating a display substrate and a counter substrate into a display panel, comprising providing a display substrate, wherein the display substrate in a peripheral area has a plurality of protruding parts and a plurality of recessing parts, resulting in an uneven surface topography; providing a counter substrate, wherein the counter substrate in at least a portion of the peripheral area has a counter surface topography substantially complementary to the surface topography of the display substrate, the counter substrate in the peripheral area has a plurality of counter protruding parts; and assembling the display substrate and the counter substrate together using a sealant filled in a space between the display substrate and a counter substrate.

Optionally, during the assembling the display substrate and the counter substrate together, the plurality of counter protruding parts of the counter substrate are disposed at positions corresponding to the plurality of recessing parts of the display substrate, a respective one of the plurality of counter protruding parts spaced apart from a respective one of the plurality of recessing parts by the sealant.

Optionally, the counter substrate in the peripheral area has a plurality of counter recessing parts; and during the assembling the display substrate and the counter substrate together, the plurality of protruding parts of the display substrate are disposed at positions corresponding to the plurality of counter recessing parts of the counter substrate, a respective one of the plurality of protruding parts spaced apart from a respective one of the plurality of counter recessing parts by the sealant.

Optionally, the counter substrate in substantially all of the peripheral area has the counter surface topography substantially complementary to the surface topography of the display substrate.

Optionally, the method further comprises providing a sealant frame prior to assembling the display substrate and the counter substrate together; wherein the sealant frame, the display substrate, and the counter substrate enclose a space into which the sealant is filled; the counter substrate in the peripheral area has a plurality of corner protrusions; and during the assembling the display substrate and the counter substrate together, a respective one of the plurality of corner protrusions is in direct contact with the sealant frame, protrudes toward a space between the sealant frame and the display substrate, and is at a corner of the display substrate.

Optionally, the method further comprises forming the counter substrate; wherein forming the counter substrate comprises forming a surface material layer on a base substrate; and patterning the surface material layer to form the plurality of counter protruding parts in the peripheral area, thereby forming the counter surface topography substantially, complementary to the surface topography of the display substrate.

Optionally, the surface material layer is patterned to further form has a plurality of corner protrusions respectively at a plurality of corners of the counter substrate.

In another aspect, the present invention provides a counter substrate, comprising a plurality of counter protruding parts in at least a portion of a peripheral area; and a plurality of corner protrusions respectively at a plurality of corners of the counter substrate.

Optionally, the counter substrate comprising a base substrate and a counter surface layer at least in the peripheral area on the base substrate; wherein the counter surface layer in the peripheral area has the plurality of counter protruding parts.

Optionally, the counter surface layer further has the plurality of corner protrusions respectively at the plurality of corners of the counter substrate.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

Figure 1:
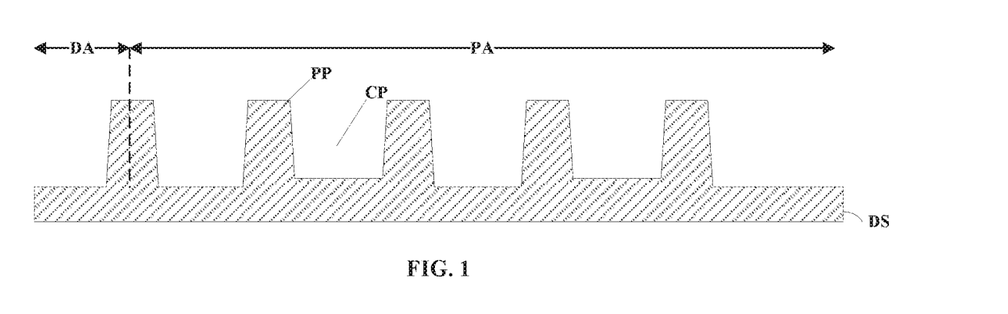
FIG. 1 is a schematic diagram illustrating the structure of a display substrate in some embodiments according to the present disclosure.
Figure 2:
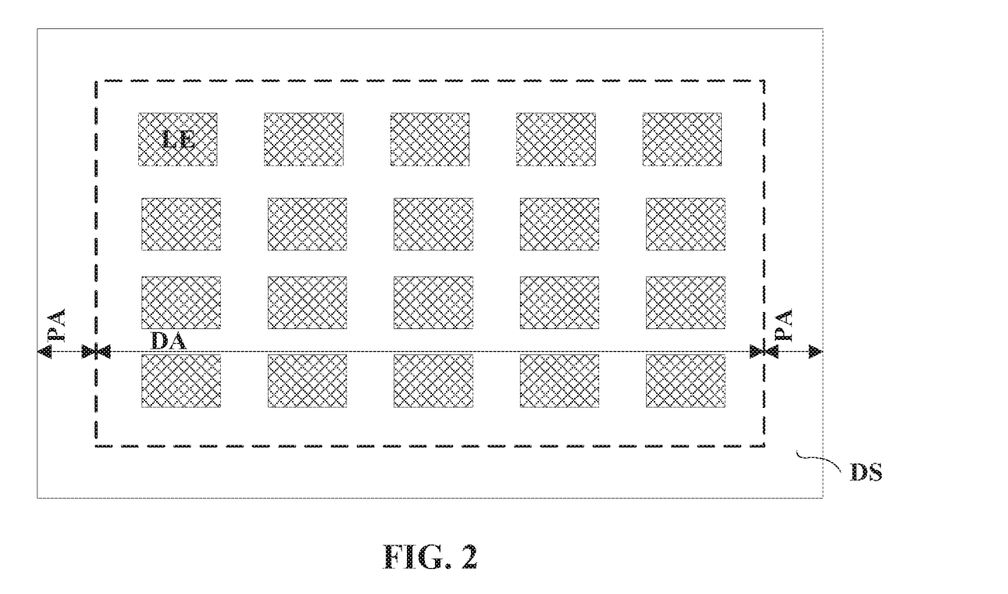
FIG. 2 is a plan view of a display substrate in some embodiments according to the present disclosure.

FIG. 1 is a schematic diagram illustrating the structure of a display substrate in some embodiments according to the present disclosure. FIG. 2 is a plan view of a display substrate in some embodiments according to the present disclosure. Referring to FIG. 1 and FIG. 2, the display substrate in some embodiments has a display area DA and a peripheral area PA. The display substrate further includes a plurality of light emitting elements LE in the display area DA. Referring to FIG. 1, the surface topography is such that the surface includes a plurality of protruding parts PP and a plurality of recessing parts CP.

Various appropriate light emitting elements may be used in the present display substrate. Examples of appropriate light emitting elements include an organic light emitting diode, a quantum dots light emitting diode, and a micro light emitting diode.

Figure 3:
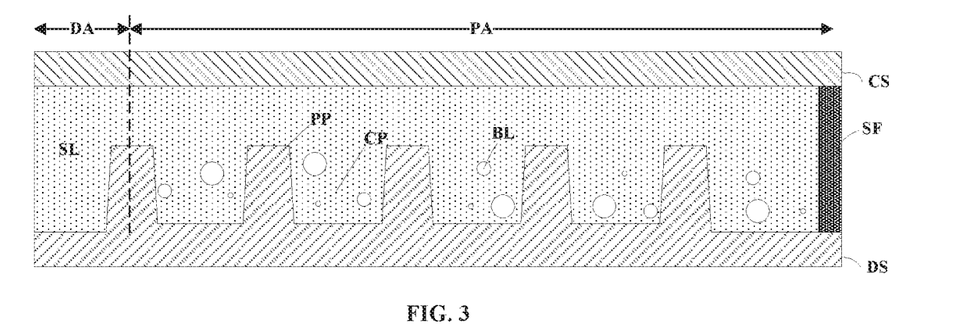
FIG. 3 illustrates an encapsulated display panel having a display substrate and a counter substrate assembled together using a sealant in some embodiments according to the present disclosure.

FIG. 3 illustrates an encapsulated display panel having a display substrate and a counter substrate assembled together using a sealant in some embodiments according to the present disclosure. Referring to FIG. 3, the display panel is fabricated by assembling the display substrate DS and a counter substrate CS together using a sealant SL. The sealant SL is confined in a space defined by a sealant frame SF on edges of the display substrate DS and the counter substrate CS, and the sealant SL fills in the space between the display substrate DS and the counter substrate CS. As shown in FIG. 3, due to the uneven surface topography of the display substrate DS, bubbles BL are prone to be trapped in the peripheral area PA and sometimes in the display area DA as well, adversely affecting encapsulation of the display panel.

Accordingly, the present disclosure provides, inter alia, a method of encapsulating a display substrate and a counter substrate, a display panel, a display apparatus, and a counter substrate that substantially obviate one or more of the problems due to limitations and disadvantages of the related art. In one aspect, the present disclosure provides a method of encapsulating a display substrate and a counter substrate into a display panel. In some embodiments, the method includes providing a display substrate, wherein the display substrate in a peripheral area has a plurality of protruding parts and a plurality of recessing parts, resulting in an uneven surface topography; providing a counter substrate, wherein the counter substrate in at least a portion of the peripheral area has a counter surface topography substantially complementary to the surface topography of the display substrate, the counter substrate in the peripheral area has a plurality of counter protruding parts and a plurality of counter recessing parts; and assembling the display substrate and the counter substrate together using a sealant filled in a space between the display substrate and a counter substrate.

As used herein, the term "substantially complementary" as used with respect to the surface topography and the counter surface topography means that features on one can be mated with opposite corresponding features on the other, such as mating a peg to a hole, or mating a convex bump to a concave depression, or mating crenellated surfaces, or mating rails in grooves. Optionally, during the assembling the display substrate and the counter substrate together, the plurality of protruding parts of the display substrate are disposed at positions corresponding to the plurality of counter recessing parts of the counter substrate; and the plurality of recessing parts of the display substrate are disposed at positions corresponding to the plurality of counter protruding parts of the counter substrate.

As used herein, the term "uneven" refers to any combination of physical undulations or surface treatments to alter the surface topography. For example, the display substrate in the peripheral area may have an uneven topography due to the presence of various metal wires, various patterns such as pixel definition layer having varying thicknesses in different local regions in the peripheral area.

As used herein, the term "display area" refers to an area of a display substrate or a display panel where image is actually displayed, and a corresponding area in a counter substrate. Optionally, the display area may include both a subpixel region and an inter-subpixel region. A subpixel region refers to a light emission region of a subpixel, such as a region corresponding to a pixel electrode in a liquid crystal display or a region corresponding to a light emissive layer in an organic light emitting diode display panel. An inter-subpixel region refers to a region between adjacent subpixel regions, such as a region corresponding to a black matrix in a liquid crystal display or a region corresponding a pixel definition layer in an organic light emitting diode display panel. Optionally, the inter-subpixel region is a region between adjacent subpixel regions in a same pixel. Optionally, the inter-subpixel region is a region between two adjacent subpixel regions from two adjacent pixels.

As used herein the term "peripheral area" refers to an area of a display substrate or a display panel where various circuits and wires are provided to transmit signals to the display substrate, and a corresponding area in a counter substrate. The peripheral area is outside the display area in a display substrate, a counter substrate, or a display panel. To increase the transparency of the display apparatus, non-transparent or opaque components of the display apparatus e.g., battery, printed circuit board, metal frame), can be disposed in the peripheral area rather than in the display areas.

Figure 4:
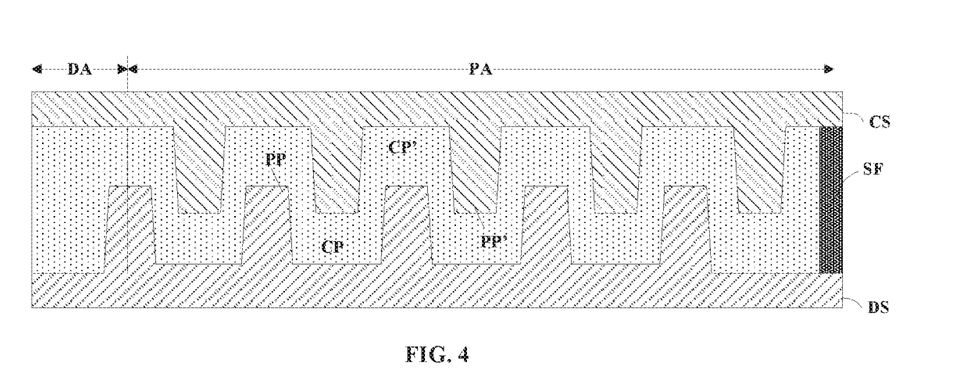
FIG. 4 illustrates an encapsulated display panel having a display substrate and a counter substrate assembled together using a sealant in some embodiments according to the present disclosure.
Figure 5:
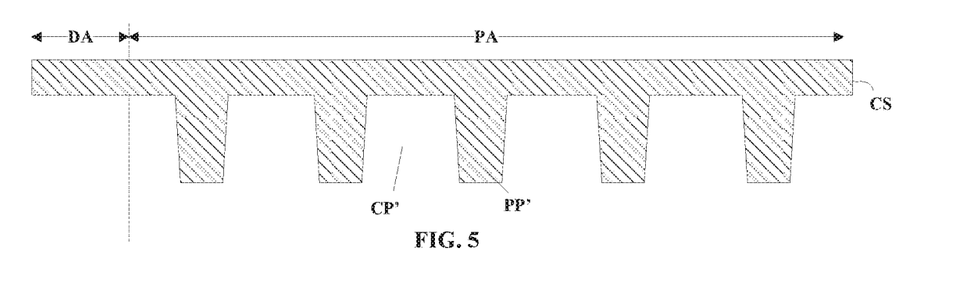
FIG. 5 is a schematic diagram illustrating the structure of a counter substrate in some embodiments according to the present disclosure.

FIG. 4 illustrates an encapsulated display panel having a display substrate and a counter substrate assembled together using a sealant in some embodiments according to the present disclosure. FIG. 4 illustrates a simplified representation of the complementary topographies of the display substrate DS and the counter substrate CS. The plurality of recessing parts CP of the display substrate DS are disposed at positions corresponding to the plurality of counter protruding parts PP' of the counter substrate CS. The plurality of protruding parts PP of the display substrate DS are disposed at positions corresponding to the plurality of counter recessing parts CP' of the counter substrate CS. FIG. 5 is a schematic diagram illustrating the structure of a counter substrate in some embodiments according to the present disclosure. Referring to FIG. 4 and FIG. 5, the counter substrate CS has a counter surface topography such that the counter substrate CS includes a plurality of counter protruding parts PP' and a plurality of counter recessing parts CP'.

As shown in FIG. 4, the counter substrate CS in at least a portion of the peripheral area PA has a counter surface topography substantially complementary to the surface topography of the display substrate DS. For example, the counter substrate CS in the peripheral area PA has a plurality of counter protruding parts PP'. During the process of assembling the display substrate DS and the counter substrate CS together, the plurality of counter protruding parts PP' of the counter substrate CS are disposed at positions corresponding to the plurality of recessing parts CP of the display substrate DS. Thus, any bubble incidentally trapped in the plurality of recessing parts CP of the display substrate DS can be readily expelled out of the sealant with the plurality of counter protruding parts PP' respectively moving toward the plurality of recessing parts CP of the display substrate DS. Further, the counter substrate CS in the peripheral area PA has a plurality of counter recessing parts CP'. Optionally, during the assembling the display substrate DS and the counter substrate CS together, the plurality of protruding parts PP of the display substrate DS are disposed at positions corresponding to the plurality of counter recessing parts CP' of the counter substrate CS, to expel any bubble incidentally trapped in the plurality of counter recessing parts CP' of the counter substrate CS.

Figure 6A:
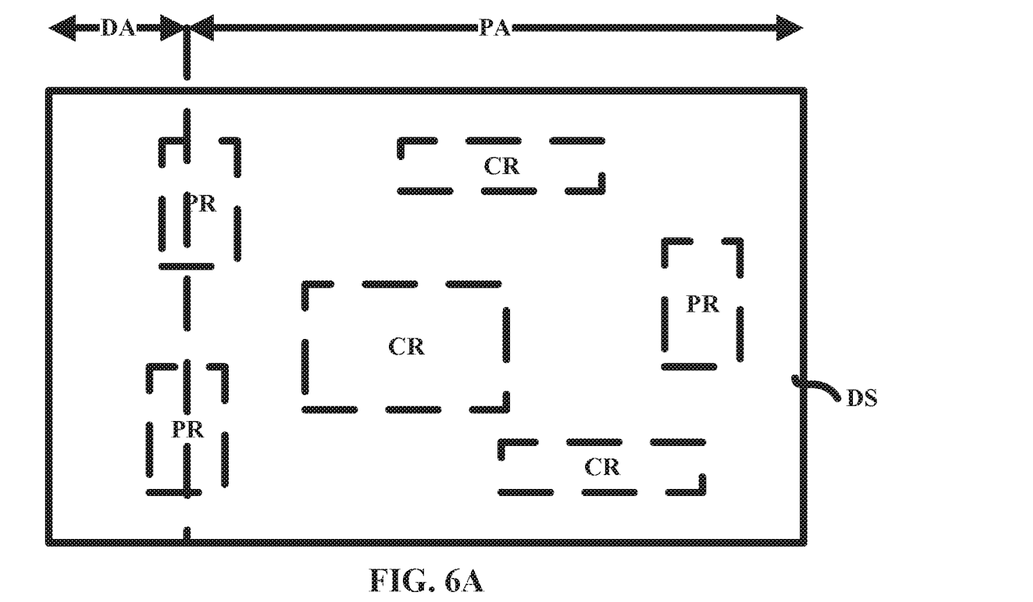
FIG. 6A is a plan view of a surface topography of a display substrate in some embodiments according to the present disclosure.
Figure 6B:
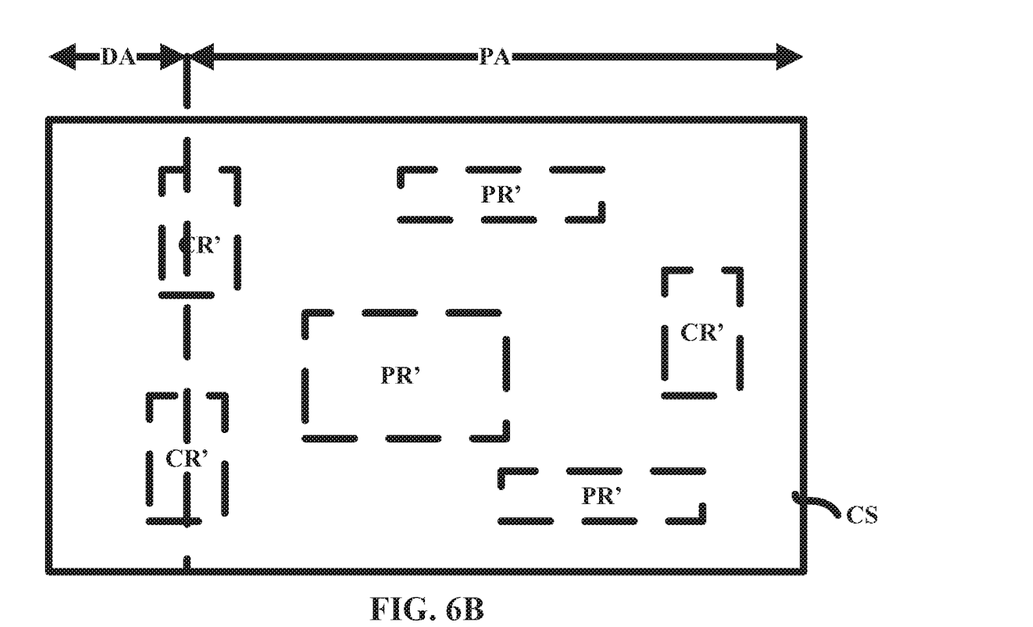
FIG. 6B is a plan view of a counter surface topography of a counter substrate in some embodiments according to the present disclosure.
Figure 6C:
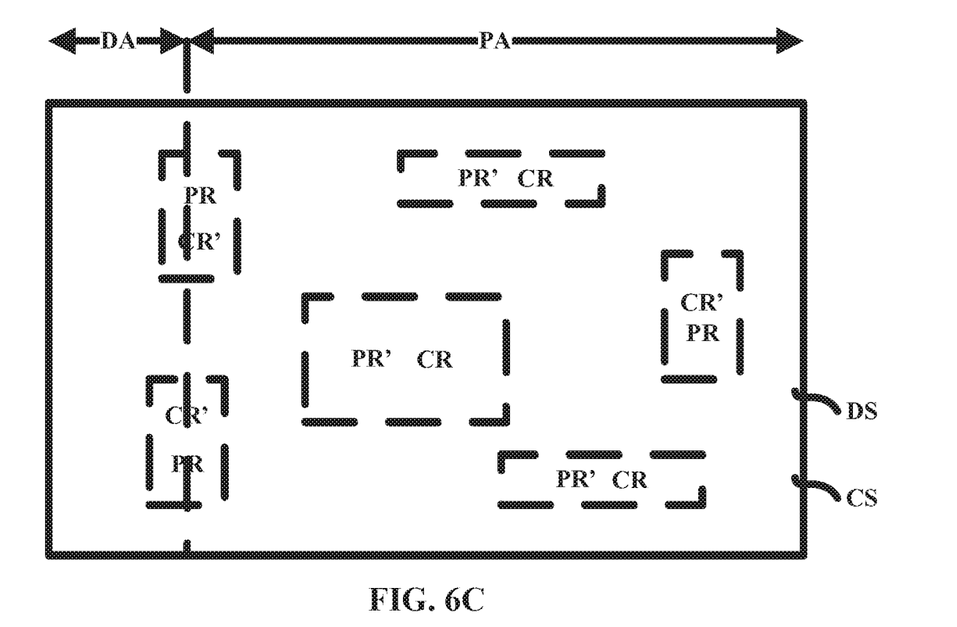
FIG. 6C is a plan view of superimposition of a surface topography of a display substrate and a counter surface topography of a counter substrate in some embodiments according to the present disclosure.

FIG. 6A is a plan view of a surface topography of a display substrate in some embodiments according to the present disclosure. Referring to FIG. 6A, the display substrate DS includes a plurality of protruding regions PR and a plurality of recessing regions CR. The plurality of protruding parts PP are respectively in the plurality of protruding regions PR. The plurality of recessing parts CP are respectively in the plurality of recessing regions CR. FIG. 6B is a plan view of a counter surface topography of a counter substrate in some embodiments according to the present disclosure. Referring to FIG. 6B, the counter substrate DS includes a plurality of counter protruding regions PR' and a plurality of counter recessing regions CR'. The plurality of counter protruding parts PP' are respectively in the plurality of counter protruding regions PR'. The plurality of counter recessing parts CP' are respectively in the plurality of counter recessing regions CR'. FIG. 6C is a plan view of superimposition of a surface topography of a display substrate and a counter surface topography of a counter substrate in some embodiments according to the present disclosure. Referring to FIGS. 6A to 6C, when the display substrate DS and the counter substrate CS are superimposed, the plurality of protruding regions PR of the display substrate DS are substantially overlapping with the plurality of counter recessing regions CR' of the counter substrate CS, and the plurality of recessing regions CR of the display substrate DS are substantially overlapping with the plurality of counter protruding parts PR' of the counter substrate CS. As used herein, the term "substantially overlap" refers to two orthographic projections at least 50%, e.g., at least 60%, at least 70%, at least 80%, at least 90%, at least 95%, at least 99%, overlapping with each other.

Referring to FIGS. 4 and 6C, in some embodiments, the display substrate DS and the counter substrate CS are assembled so that the plurality of protruding parts PP of the display substrate DS are disposed at positions corresponding to the plurality of counter recessing parts CP' of the counter substrate CS; and the plurality of recessing parts CP of the display substrate DS are disposed at positions corresponding to the plurality of counter protruding parts PP' of the counter substrate CS. Optionally, the plurality of recessing parts CP of the display substrate DS are disposed at positions corresponding to the plurality of counter protruding parts PP' of the counter substrate CS; and the plurality of protruding parts PP of the display substrate DS are disposed at positions corresponding to the plurality of counter recessing parts CP' of the counter substrate CS.

Figure 7:
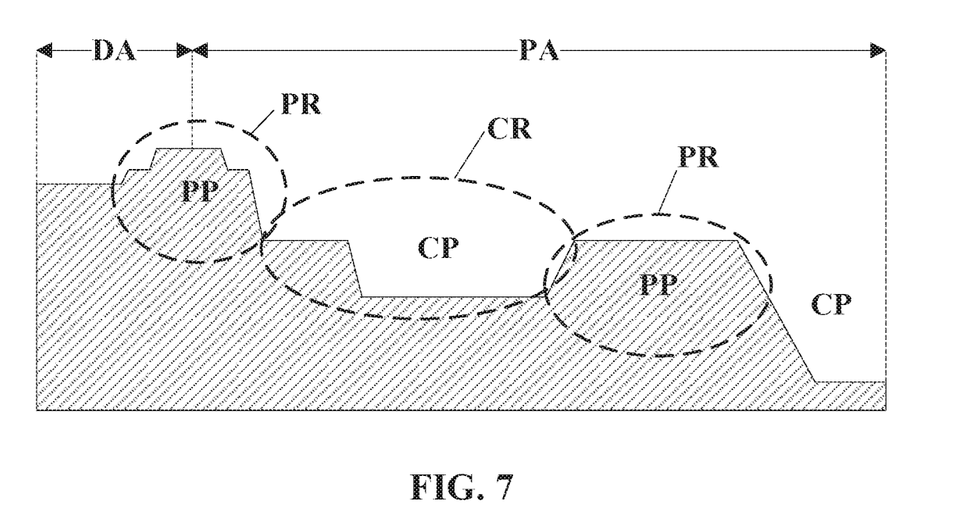
FIG. 7 is a schematic diagram illustrating the structure of a display substrate in some embodiments according to the present disclosure.
Figure 8:
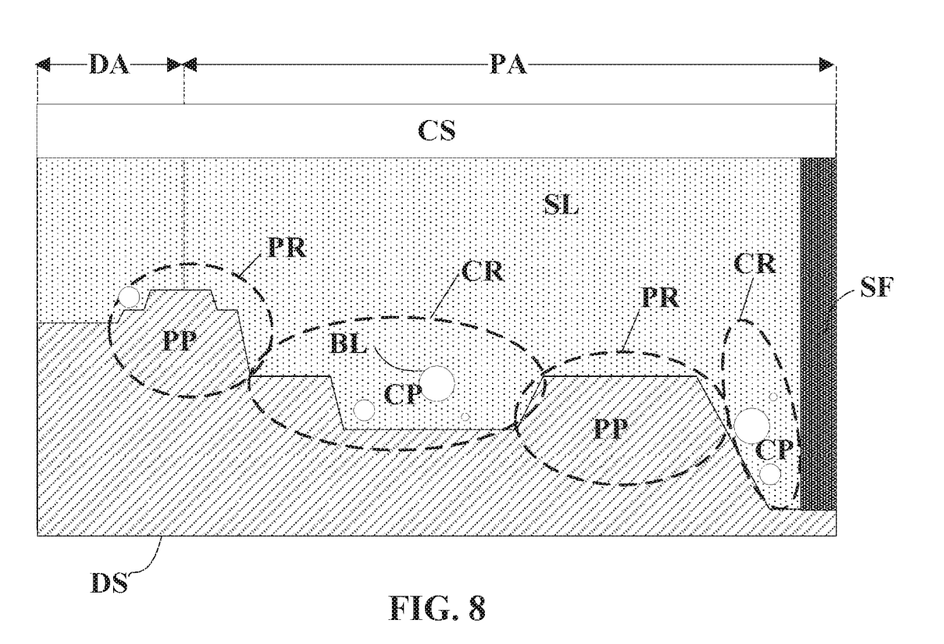
FIG. 8 illustrates an encapsulated display panel having a display substrate and a counter substrate assembled together using a sealant in some embodiments according to the present disclosure.
Figure 9:
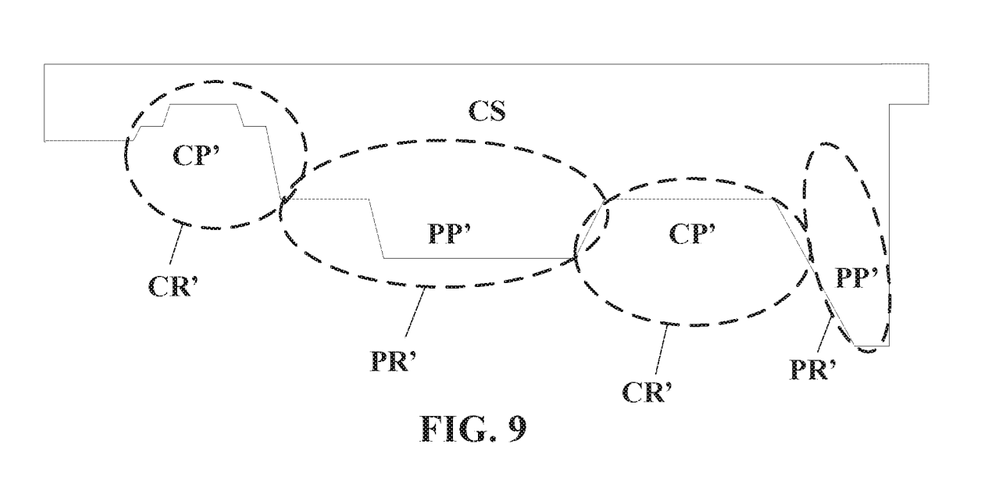
FIG. 9 is a schematic diagram illustrating the structure of a counter substrate in some embodiments according to the present disclosure.
Figure 10:
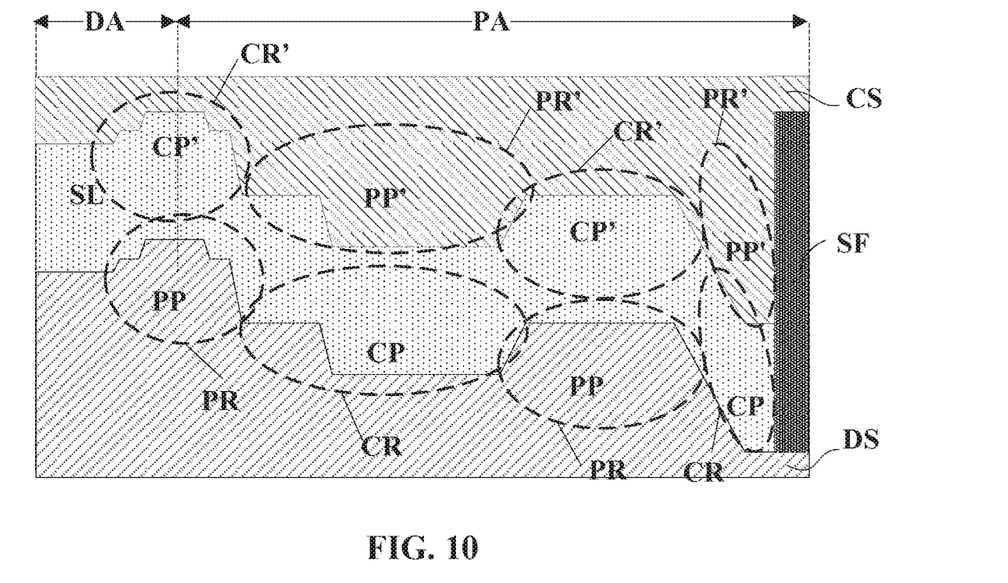
FIG. 10 illustrates an encapsulated display panel having a display substrate and a counter substrate assembled together using a sealant in some embodiments according to the present disclosure.

FIG. 7 is a schematic diagram illustrating the structure of a display substrate in some embodiments according to the present disclosure. Referring to FIG. 7, the surface topography of the display substrate DS is such that the surface includes a plurality of protruding parts PP respectively in a plurality of protruding regions PR and a plurality of recessing parts CP respectively in a plurality of recessing regions CR. FIG. 8 illustrates an encapsulated display panel having a display substrate and a counter substrate assembled together using a sealant in some embodiments according to the present disclosure. Referring to FIG. 8, due to the uneven surface topography of the display substrate DS, bubbles BL are prone to be trapped in the peripheral area PA and sometimes at a border region between in the display area DA and the peripheral region PA, adversely affecting encapsulation of the display panel. FIG. 9 is a schematic diagram illustrating the structure of a counter substrate in some embodiments according to the present disclosure. Referring to FIG. 9, the counter substrate CS has a counter surface topography such that the counter substrate CS includes a plurality of counter protruding parts PP' respectively in a plurality of counter protruding regions PR' and a plurality of counter recessing parts CP' respectively in a plurality of counter recessing regions CR'. FIG. 10 illustrates an encapsulated display panel having a display substrate and a counter substrate assembled together using a sealant in some embodiments according to the present disclosure. Referring to FIG. 10, the display panel is fabricated by assembling the display substrate DS and a counter substrate CS together using a sealant SL. The sealant SL is confined in a space defined by a sealant frame SF on edges of the display substrate DS and the counter substrate CS, and the sealant SL fills in the space between the display substrate DS and the counter substrate CS. The plurality of recessing parts CP of the display substrate DS are disposed at positions corresponding to the plurality of counter protruding parts PP' of the counter substrate CS. The plurality of protruding parts PP of the display substrate DS are disposed at positions corresponding to the plurality of counter recessing parts CP' of the counter substrate CS. Due to the substantially complementary surface topographies of the display substrate DS and the counter substrate CS, any bubble incidentally trapped in recessing parts (e.g., the plurality of recessing parts CP or the plurality of counter recessing parts CP') can be readily expelled out of the sealant SL.

Figure 11:
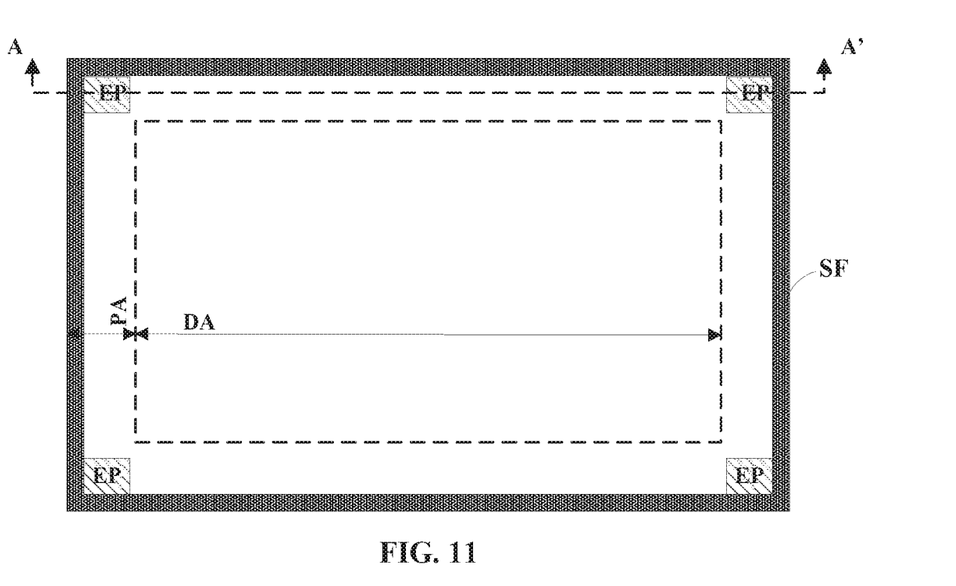
FIG. 11 is a plan view of an encapsulated display panel having a display substrate and a counter substrate assembled together using a sealant in some embodiments according to the present disclosure.
Figure 12:
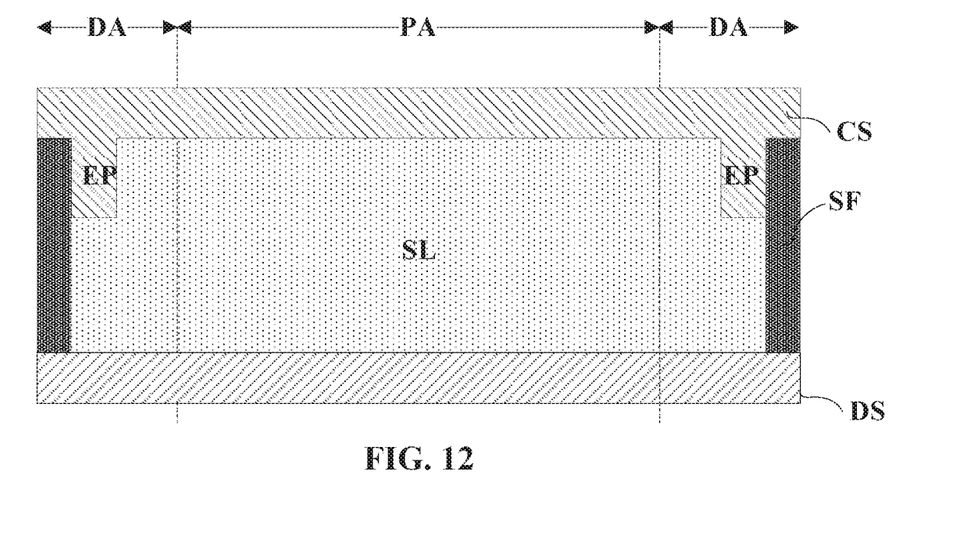
FIG. 12 is a cross-sectional view of along an A-A line in FIG. 11.

FIG. 11 is a plan view of an encapsulated display panel having a display substrate and a counter substrate assembled together using a sealant in some embodiments according to the present disclosure. FIG. 12 is a cross-sectional view of along an A-A line in FIG. 11. Referring to FIG. 11 and FIG. 12, in some embodiments, the counter substrate CS further includes a plurality of corner protrusions EP respectively at a plurality of corner regions of the counter substrate CS. It is discovered in the present disclosure that bubbles are particularly prone to be trapped in corner regions of the display substrate DS, in a space between the sealant frame SF and the display substrate DS (see, e.g., FIG. 8). By having a plurality of corner protrusions EP respectively at a plurality of corner regions of the counter substrate CS, any bubble incidentally trapped in said space during the assembling the display substrate DS and the counter substrate CS together can be readily expelled out of the sealant SL. In some embodiments, when the display substrate DS and a counter substrate CS are assembled together, a respective one of the plurality of corner protrusions EP is in direct contact with the sealant frame SF, protrudes toward a space between the sealant frame SF and the display substrate DS, and is at a corner of the display substrate DS. The respective one of the plurality of corner protrusions EP is spaced apart from the display substrate DS by the sealant SL. Optionally, a total number of the plurality of corner protrusions EP in the encapsulated display panel is in a range of 1 to 4, e.g., 2 or 4.

Figure 13:
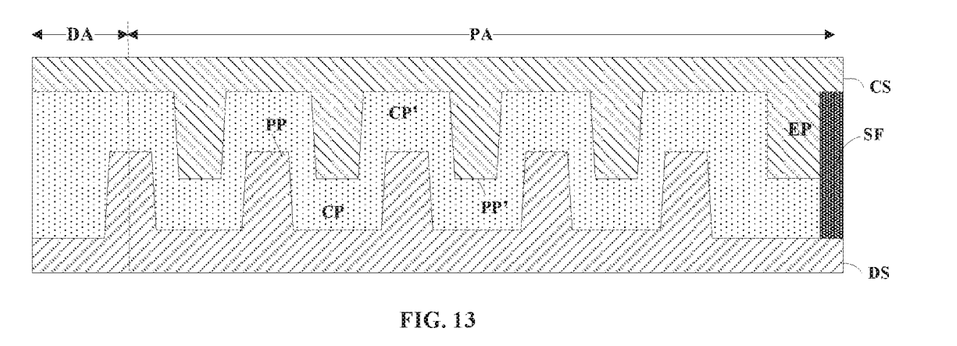
FIG. 13 illustrates an encapsulated display panel having a display substrate and a counter substrate assembled together using a sealant in some embodiments according to the present disclosure.

FIG. 13 illustrates an encapsulated display panel having a display substrate and a counter substrate assembled together using a sealant in some embodiments according to the present disclosure. Referring to FIG. 13, the display substrate DS has a surface topography such that the surface of the display substrate DS includes a plurality of protruding parts PP and a plurality of recessing parts CP. The counter substrate CS in at least a portion of the peripheral area. PA has a counter surface topography substantially complementary to the surface topography of the display substrate DS. The counter substrate CS in the peripheral area PA has a plurality of counter protruding parts PP', and a plurality of corner protrusions EP respectively at a plurality of corner regions of the counter substrate CS. The display substrate DS and the counter substrate CS are assembled together so that the plurality of counter protruding parts PP' of the counter substrate CS are disposed at positions corresponding to the plurality of recessing parts CP of the display substrate DS, and the plurality of corner protrusions EP is in direct contact with the sealant frame SF. When the display substrate DS and a counter substrate CS are assembled together, a respective one of the plurality of corner protrusions EP is in direct contact with the sealant frame SF, protrudes toward a space between the sealant frame SF and the display substrate DS, and is at a corner of the display substrate DS. The plurality of counter protruding parts PP' and the plurality of corner protrusions EP are spaced apart from the display substrate DS by the sealant SL.

Figure 14A:
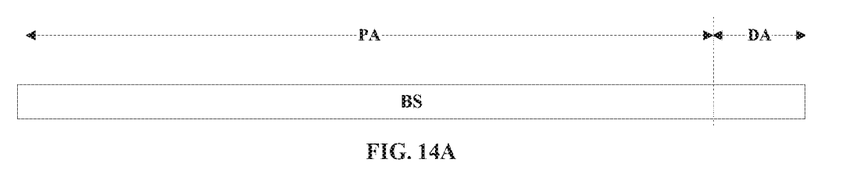
FIGS. 14A to 14C illustrate a method of fabricating a counter substrate in some embodiments according to the present disclosure.
Figure 14B:
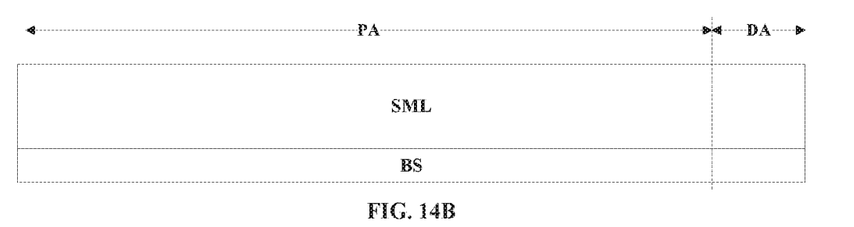
Figure 14C:
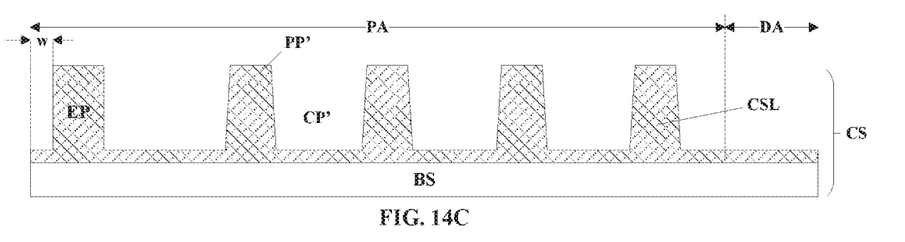

FIGS. 14A to 14C illustrate a method of fabricating a counter substrate in some embodiments according to the present disclosure. Referring to FIG. 14A, a base substrate BS is provided. The base substrate BS has a substantially flat surface. As used herein, the term "substantially flat surface" may include small deviations from flat surface geometries, for example, deviations due to manufacturing processes.

Referring to FIG. 14B, a surface material layer SML is formed on the base substrate BS. Various appropriate surface materials may be used for forming the surface material layer SML. Examples of appropriate surface materials include a black material, a resin material, and a photoresist material.

Optionally, the surface material layer SML is formed to have a thickness in a range of 0.1 μm to 5 μm.

Referring to FIG. 14C, the surface material layer is patterned to form a counter surface layer CSL having the plurality of counter protruding parts PP' in the peripheral area PA, thereby forming the counter surface topography substantially complementary to the surface topography of the display substrate. Optionally, the surface material layer is patterned to form the counter surface layer CSL having the plurality of counter protruding parts PP' and a plurality of counter recessing parts CP' in the peripheral area PA. Optionally, the surface material layer is patterned to form the counter surface layer CSL further having a plurality of corner protrusions EP respectively at the plurality of corners of the counter substrate. Optionally, a respective one of the plurality of corner protrusions EP is formed to be spaced apart from an outer edge of a respective one of the plurality of corners of the counter substrate by a distance w. Optionally, the distance w is approximately a width of the sealant frame to be used for assembling the counter substrate and a display substrate to form a display panel.

In another aspect, the present disclosure provides an encapsulated display panel. Referring to FIGS. 4, 10, and 13, in some embodiments, the encapsulated display panel includes a display substrate DS; a counter substrate CS facing the display substrate DS; a sealant SL filled in a space between the display substrate DS and a counter substrate CS. Optionally, the display substrate DS in a peripheral area PA has a plurality of protruding parts PP and a plurality of recessing parts CP, resulting in an uneven surface topography. Optionally, the counter substrate CS in at least a portion of the peripheral area PA has a counter surface topography substantially complementary to the surface topography of the display substrate, the counter substrate CS in the peripheral area PA has a plurality of counter protruding parts PP'.

Optionally, the plurality of counter protruding parts PP' of the counter substrate CS are disposed at positions corresponding to the plurality of recessing parts CP of the display substrate DS, a respective one of the plurality of counter protruding parts PP' is spaced apart from a respective one of the plurality of recessing parts CP by the sealant SL.

Optionally, the counter substrate CS in the peripheral area PA has a plurality of counter recessing parts CP'. Optionally, the plurality of protruding parts of the display substrate are disposed at positions corresponding to the plurality of counter recessing parts of the counter substrate, a respective one of the plurality of protruding parts is spaced apart from a respective one of the plurality of counter recessing parts by the sealant SL.

Optionally, the counter substrate CS in substantially all of the peripheral area. PA has the counter surface topography substantially complementary to the surface topography of the display substrate DS.

In some embodiments, the encapsulated display panel further includes a sealant frame SF. The sealant frame SF, the display substrate DS, and the counter substrate CS enclose a space into which the sealant SL is filled. Optionally, the counter substrate CS in the peripheral area PA has a plurality of corner protrusions EP. Optionally, a respective one of the plurality of corner protrusions EP is in direct contact with the sealant frame SF, protrudes toward a space between the sealant frame SF and the display substrate DS, and is at a corner of the display substrate DS.

In some embodiments, referring to FIG. 14C, the counter substrate CS includes a base substrate BS, and a counter surface layer CSL including the plurality of counter protruding parts PP' at least in the peripheral area PA on the base substrate BS. The counter surface layer CSL includes the counter surface topography substantially complementary to the surface topography of the display substrate. Optionally, the counter surface layer CSL further includes a plurality of corner protrusions EP. Referring to FIG. 13, a respective one of the plurality of corner protrusions EP is in direct contact with the sealant frame SF, protrudes toward a space between the sealant frame SF and the display substrate DS, and is at a corner of the display substrate DS.

In another aspect, the present disclosure provides a display apparatus including a display panel described herein, and one or more integrated circuits connected to the display substrate. Examples of appropriate display apparatuses include, but are not limited to, an electronic paper, a mobile phone, a tablet computer, a television, a monitor, a notebook computer, a digital album, a GPS, etc. Optionally, the display substrate is an organic light emitting diode display substrate, and the display apparatus is an organic light emitting diode display apparatus.

In another aspect, the present disclosure provides a counter substrate. Referring to FIG. 14C, in some embodiments, the counter substrate CS includes a plurality of counter protruding parts PP' in at least a portion of the peripheral area PA; and a plurality of corner protrusions EP respectively at a plurality of corners of the counter substrate CS. Optionally, the counter substrate CS further includes a plurality of counter recessing parts CP' in the at least a portion of the peripheral area PA. Optionally, a respective one of the plurality of corner protrusions EP is spaced apart from an outer edge of a respective one of the plurality of corners of the counter substrate CS by a distance w. Optionally, the distance w is approximately a width of the sealant frame to be used for assembling the counter substrate CS and a display substrate to form a display panel.

In some embodiments, the counter substrate CS includes a base substrate BS and a counter surface layer CSL at least in the peripheral area PA on the base substrate BS. The counter surface layer CSL in the peripheral area PA has the plurality of counter protruding parts PP'. Optionally, the counter surface layer CSL further includes the plurality of corner protrusions CP' respectively at the plurality of corners of the counter substrate CS.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. An encapsulated display panel, comprising:
a display substrate;
a counter substrate facing the display substrate; and
a sealant filled in a space between the display substrate and a counter substrate;
wherein the display substrate in a peripheral area has a plurality of protruding parts and a plurality of recessing parts, resulting in an uneven surface topography;
the counter substrate in at least a portion of the peripheral area has a counter surface topography substantially complementary to the surface topography of the display substrate, the counter substrate in the peripheral area has a plurality of counter protruding parts;
the counter substrate in the peripheral area has a plurality of corner protrusions abutting a plurality of corners of the sealant frame, respectively;
a respective one of the plurality of corner protrusions is in direct contact with the sealant frame; and
the respective one of the plurality of corner protrusions protrudes into a recess having the sealant and the sealant frame as side walls.

2. The encapsulated display panel of claim 1, wherein the plurality of counter protruding parts of the counter substrate are disposed at positions corresponding to the plurality of recessing parts of the display substrate, a respective one of the plurality of counter protruding parts spaced apart from a respective one of the plurality of recessing parts by the sealant.

3. The encapsulated display panel of claim 2, wherein the counter substrate in the peripheral area has a plurality of counter recessing parts; and
the plurality of protruding parts of the display substrate are disposed at positions corresponding to the plurality of counter recessing parts of the counter substrate, a respective one of the plurality of protruding parts spaced apart from a respective one of the plurality of counter recessing parts by the sealant.

4. The encapsulated display panel of claim 1, wherein the counter substrate in substantially all of the peripheral area has the counter surface topography substantially complementary to the surface topography of the display substrate.

5. The encapsulated display panel of claim 1, further comprising a sealant frame;
wherein the sealant frame, the display substrate, and the counter substrate enclose a space into which the sealant is filled.

6. The encapsulated display panel of claim 1, wherein a total number of the plurality of corner protrusions is four.

7. The encapsulated display panel of claim 1, wherein the counter substrate comprises:
a base substrate; and
a counter surface layer comprising the plurality of counter protruding parts at least in the peripheral area on the base substrate;
wherein the counter surface layer comprises the counter surface topography substantially complementary to the surface topography of the display substrate.

8. The encapsulated display panel of claim 7, wherein the counter surface layer further comprises the plurality of corner protrusions.

9. A display apparatus, comprising the encapsulated display panel of claim 1, and one or more integrated circuits connected to the display substrate.

* * * * *